(12) United States Patent
Deng

(10) Patent No.: US 7,674,390 B2
(45) Date of Patent: Mar. 9, 2010

(54) ZEOLITE—SOL GEL NANO-COMPOSITE LOW K DIELECTRIC

(75) Inventor: Hai Deng, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 10/716,254

(22) Filed: Nov. 17, 2003

(65) Prior Publication Data

US 2005/0103744 A1 May 19, 2005

(51) Int. Cl.
 *H01B 13/00* (2006.01)
(52) U.S. Cl. ........... 216/18; 257/E21.273; 257/E21.576
(58) Field of Classification Search ................... None
 See application file for complete search history.

(56) References Cited

U.S. PATENT DOCUMENTS

| | | | | |
|---|---|---|---|---|
| 4,402,717 A | * | 9/1983 | Izumo et al. | 96/118 |
| 4,599,321 A | * | 7/1986 | Rainis | 502/8 |
| 4,612,298 A | * | 9/1986 | Hettinger et al. | 502/65 |
| 5,051,385 A | * | 9/1991 | Wachter | 502/64 |
| 6,329,062 B1 | | 12/2001 | Gaynor | |
| 6,573,131 B2 | | 6/2003 | Yan et al. | |
| 6,808,867 B2 | * | 10/2004 | Doshi et al. | 430/320 |
| 2002/0041970 A1 | | 4/2002 | Gaynor | |
| 2002/0197645 A1 | * | 12/2002 | Martin | 435/7.1 |
| 2003/0162650 A1 | * | 8/2003 | Marques et al. | 502/64 |
| 2004/0091419 A1 | | 5/2004 | Ogihara et al. | |

FOREIGN PATENT DOCUMENTS

| | | |
|---|---|---|
| JP | 2004 79592 A | 3/2004 |
| JP | 2004 168588 A | 6/2004 |

OTHER PUBLICATIONS

Morris, et al. Method of Fabrication of Low Dielectric Constant Porous Metal Silicate Films, U.S. Appl. No. 10/323,988, filed Dec. 17, 2002, 23 pages.
Zhengbao Wang, et al., Pure Silica Zeolite Films as Low-k Dielectrics by Spin-On of Nanoparticle Suspensions, Advanced Materials 2001, No. 19, Oct. 2, pp. 1463-1466.
Zhengbao Wang, et al., Silica Zeolite Low-k Dielectric Films, Department of Chemical and Environmental Engineering, University of California, Riverside, 15 pages.
Wang, H. et al. "Colloidal Suspensions of Template-Removed Zeolite Nanocrystals," Chemical Communications, Chemcom, Royal Society of Chem. GB, (2000) pp. 2333-2334.
Patent Abstracts of Japan vol. 2003, No. 12, Dec. 5, 2003 JP 2004 168588 A (Asahi Kasei Corp.), 1 page.
Patent Abstracts of Japan vol. 2003, No. 12, Dec. 5, 2003 JP 2004 079592 A (Asahi Kasei Corp.), 1 page.

* cited by examiner

*Primary Examiner*—Allan Olsen
(74) *Attorney, Agent, or Firm*—David P. McAbee

(57) ABSTRACT

A method for forming a sol gel-zeolite composite dielectric material is herein described. Zeolite particles may be dispersed in a sol creating a liquid sol-zeolite colloid. The liquid sol-zeolite colloid may be deposited on an underlying layer. The liquid sol-zeolite colloid may be formed into a wet gel-zeolite composite. All of the liquid may be extracted from the wet gel-zeolite composite to form an aerogel-zeolite composite. Then the wet gel-zeolite composite or the aerogel-zeolite composite may be calcined to freeze the structure of the composite material.

24 Claims, 5 Drawing Sheets

ZEOLITE—SOL GEL NANO-COMPOSITE LOW K DIELECTRIC

FIELD

This invention relates to the field of fabricating semiconductor devices and, in particular, to composite low k dielectrics.

BACKGROUND

Modern integrated circuits generally contain several layers of interconnect structures fabricated above a substrate. The substrate may have active devices and/or conductors that are connected by the interconnect structure.

Interconnect structures, typically comprising trenches and vias, are usually fabricated in, or on, an interlayer dielectric (LD). It is generally accepted that, the dielectric material in each ILD should have a low dielectric constant (k) to obtain low capacitance between conductors. Decreasing this capacitance between conductors, by using a low dielectric constant (k), results in several advantages. For instance, it provides reduced RC delay, reduced power dissipation, and reduced cross-talk between the metal lines.

Some materials that may be used for ILDs are sol gel dielectrics. Sol gel materials, such as silica sol gels, start as a sols, or solutions, and go through a phase transition to form a wet gel. Typically, the solvent is extracted from the wet gel to form an ILD, with pores distributed through out the ILD. These pores allow sol gel materials to obtain low k dielectrics. However, these dielectrics often posses bad mechanical properties, which leads to fragility during hardening and semiconductor fabrication. For example, ILDs with weak mechanical properties may crack or otherwise break down during harsh fabrications steps, such as chemical mechanical polish (CMP).

Another material that may be used for ILDs is zeolite or silica zeolite. Zeolite films are advantageous in that they have a relatively uniform pore distribution and have good mechanical strength. Furthermore, zeolite films have dielectric constants (k values) in the range of 2 and below. Yet, zeolite is a crystalline structure, which makes forming a uniform film extremely difficult. Discontinuities in an ILD may cause line to line leakage or diffusion into the ILD materials.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as examples of specific, sols, alcohols, acids, silicate precursors, etc. in order to provide a thorough understanding of the present invention. It will be apparent, however, to one skilled in the art that these specific details need not be employed to practice the present invention. In other instances, well known methods and materials, such as spin-coating, dip-coating, and sol-gel processing have not been described in detail in order to avoid unnecessarily obscuring the present invention.

The method and apparatus described herein are for forming interlayer dielectrics (ILDs) from a zeolite-sol gel composite. A composite may be any combination of two or more materials, such as silica sol gel and zeolite, whether actual bonds are present or not. A composite may also be a material formed from a combination of materials which differ in composition or form and retain their identities and properties. A composite may also include a nano-composite, where the zeolite particles are nano sized in a silica sol gel matrix. It is readily apparent that any sol-gel materials may be used in combination with zeolite to form a zeolite-sol gel composite dielectric/film. However, as not to obscure the invention this disclosure will focus on silica base sol-gels to describe the methods for forming composite zeolite-sol gel films.

Figure 1:
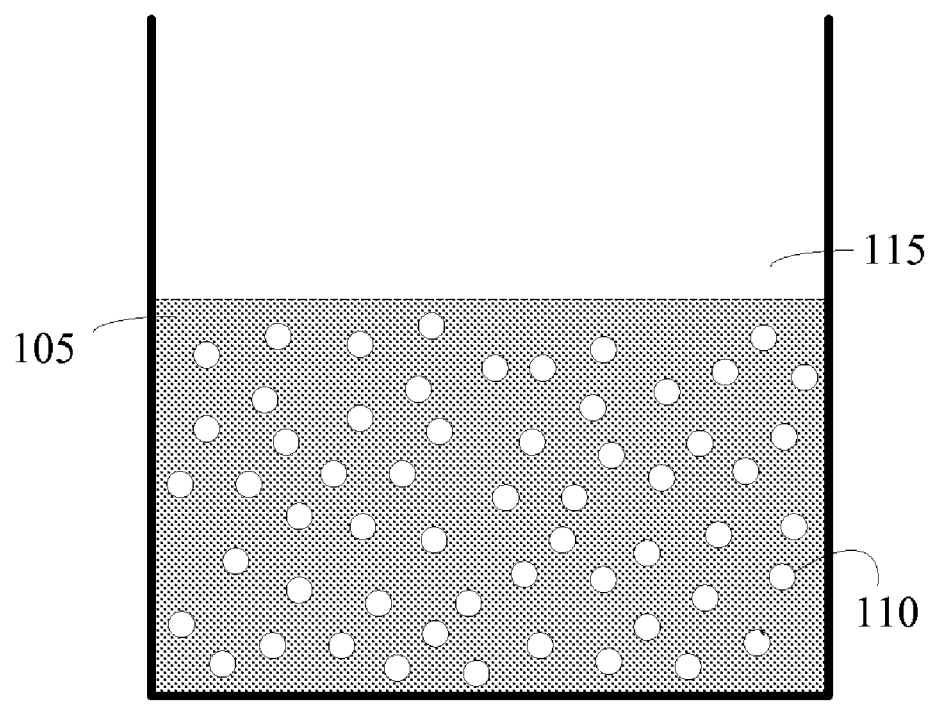
FIG. 1 illustrates a sol with zeolite particles dispersed in the sol to make a sol-zeolite colloid.

FIG. 1 illustrates a liquid zeolite colloidal suspension solution (sol). Zeolite-sol colloid 115 may comprise liquid sol 105 that contains colloidal suspended zeolite particles 110. Zeolite particles 110 may be dispersed in liquid sol 105 by adding them to liquid sol 105. Furthermore, zeolite particles 110 may be may be dispersed in liquid sol 105 by stirring both zeolite particles 110 and liquid sol 105. For example, zeolite particles 110 may be dispersed into liquid sol 105 by putting the solution in a centrifuge and spinning liquid sol 105 until zeolite particles 110 are suspended in zeolite-sol colloid 115.

Liquid sol 105 may be any solution used to form sol-gel films. As one example, liquid sol 105 may be a silica sol. Liquid sol 105 may include an alcohol-type solvent such as ethanol, methanol, 1- or 2-propanol, and 1-butanol. Liquid sol 105 may include an acid as an acid hydrolysis catalyst. Some acids that may be used include: hydrochloric (HCl), nitric, sulfuric, phosphoric, hydrofluoric (HF), acetic, and citric acids. In addition, liquid sol 105 may also include a silicon precursor, such as tetraethoxysilane (TEOS), tetramethoxysilane (TMOS), tetrapropoxysilane (TPOS), and tetrabutoxysilane (TBOS). Liquid sol 105 may also include a controlled amount of water. It is readily apparent that other material may be added to liquid sol 105, such as metal or any other material.

The molar percentage of zeolite particles 110 over liquid sol-zeolite colloid 115 may be varied to obtain any viscosity of colloid 115 or varied to obtain different mechanical properties in the final zeolite-gel composite dielectric, which is discussed later in reference to the later Figures. For example, the zeolite particles 110 may have a molar percentage of 1% of the zeolite-sol colloid 115. As another example, the zeolite particles 110 may have a molar percentage of 50% of the zeolite-sol colloid 115. It is readily apparent that the percent of zeolite particles 110 to zeolite-sol colloid 115 may be any molar percentage.

Figure 2:
FIG. 2 is a cross-sectional elevation view of an underlying layer with a conductor and an etch stop disposed on the underlying layer.

Turning to FIG. 2, and underlying layer 205 is depicted, which often is comprised of several active devices and/or a layer with conductors exposed. Underlying layer 205 may be a semiconductor wafer including device regions, other structures such as gates, local interconnects, metal layers, or other active/passive device structures or layers. In FIG. 2, underlying layer 205 has underlying conductor 210. Underlying conductor 210 may be copper or copper alloy, as well as some other conductive material such as gold. Underlying layer 205 may be a wet gel or gel-zeolite composite dielectric in accordance with this disclosure, which may contain any of the aforementioned devices.

Figure 3:
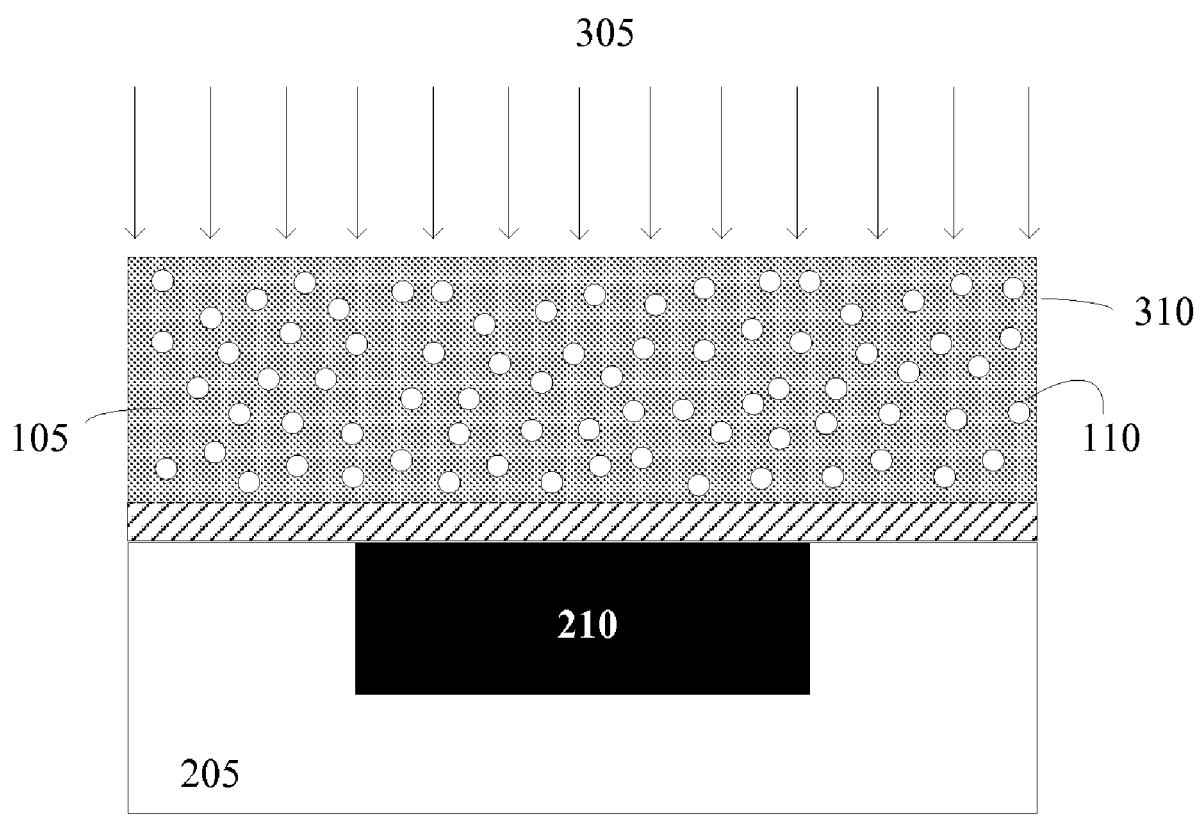
FIG. 3 is a cross-sectional elevation view of the sol-zeolite colloid from FIG. 1 after it has been deposited on the underlying layer from FIG. 2.

FIG. 3 depicts a layer 310 disposed on underlying layer 205 after a zeolite-sol colloid, such as zeolite-sol colloid 115 as shown in FIG. 1, has been deposited on underlying layer 205 through deposition process 305. The zeolite-sol colloid may be deposited on underlying layer 205 in any variety of known methods. For example, the zeolite-sol colloid may be deposited by dip-coating underlying layer 205 in the zeolite-sol colloid. As another example, the zeolite-sol colloid may be deposited by spin-coating the zeolite-sol colloid on underlying layer 205. It is readily apparent that these well-known methods, as well as other well-known methods, of depositing dielectric material may be used to deposit the zeolite-sol colloid on underlying layer 205.

Figure 4:
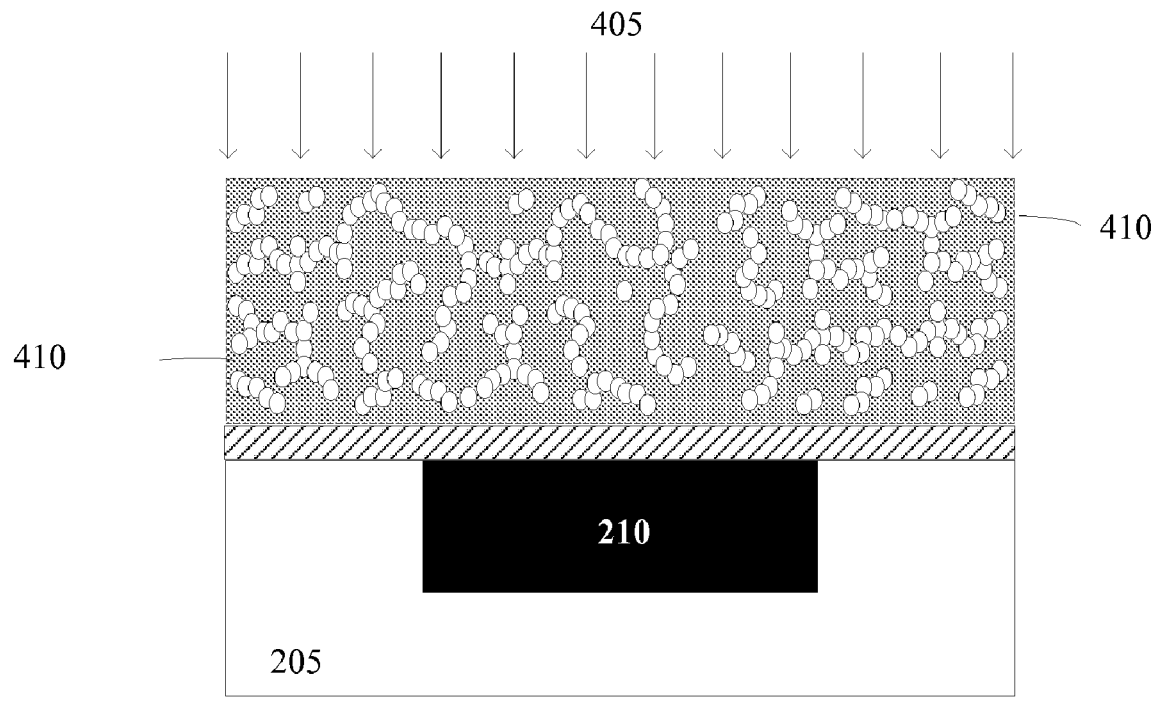
FIG. 4 is a cross-sectional elevation view of FIG. 3 after extracting some solvent to form a wet gel.

FIG. 4 illustrates wet gel-zeolite composite 410 after a zeolite-sol colloid, such as zeolite-sol colloid 115 as shown in FIG. 1, has been formed into a wet gel. The zeolite-sol colloid may be formed into a wet gel by extracting at least some of the liquid/solvent present in the zeolite-sol colloid, as illustrated in extraction step 405. Any amount of liquid may be extracted to form a wet gel with different properties. For example, a small amount of liquid may be extracted leaving the wet gel viscous and pliable, so as not to crack during hardening or further processing steps. As another example, some or almost all of the liquid may be extracted to form a wet gel that is closer to a solid phase transition having different mechanical properties. As yet another example, all of the liquid may be extracted from the zeolite-sol colloid to form an aerogel-zeolite composite, which is discussed in more detail in reference to FIG. 5.

Extraction step 405 may be any method that extracts liquid from the zeolite-sol colloid. Extraction step 405 may include heating the interconnect structure. As an example, the structure may be placed in an oven or furnace and heated to any temperature above room temperature over an amount of time. As another example, extraction step 405 may include oxidizing the zeolite-sol colloid. Oxidizing the zeolite-sol colloid may include allowing the air to oxidize the zeolite-sol colloid over a period of time or exposing the structure to an induced ozone. Extraction step 405 may also include drying the zeolite-sol colloid. As an illustrative example, the structure may be dried in air at 40° C. to 80° C. for a period time. Extraction step 405 may also include vacuuming the liquid from the zeolite-sol colloid. For instance, the structure may be placed under a vacuum to extract the liquid from the zeolite-sol colloid.

It is readily apparent that each of the methods of extraction of liquid from a zeolite-sol colloid may individually or combinationally be used to extract at least some liquid from the zeolite-sol colloid. As an illustrative example, the zeolite-sol colloid may be heated in an oven while under a vacuum. As another illustrative example, the structure may be dried in air and then separately heated. As noted above, any amount of liquid may be extracted from the zeolite-sol colloid to form wet gel-zeolite composite 410 and to obtain different gel matrices that differ in mechanical properties and k values.

Figure 5:
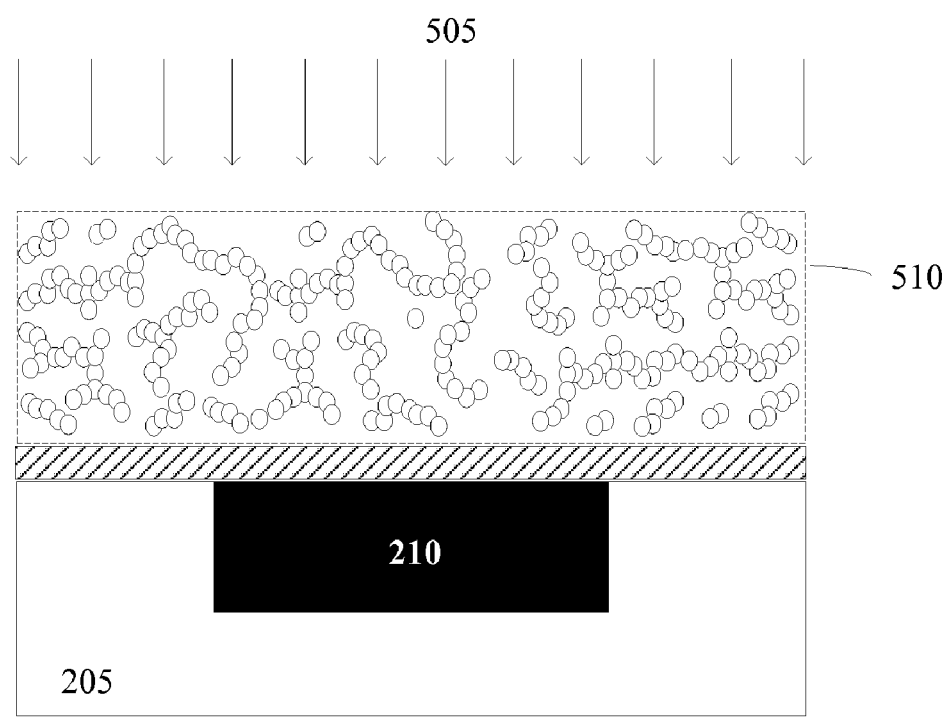
FIG. 5 is a cross-sectional elevation view of FIG. 4 after approximately all of the solvent has been extracted to form an aerogel.

Furthermore, as shown in FIG. 5, approximately any remaining liquid in the wet gel (previously formed from a zeolite-sol colloid) may be extracted to form aerogel-zeolite composite 510 through extraction step 605. By using different extraction conditions (vacuum, temperatures, various extraction rate), the resulting aerogel-zeolite composite 510 is variable to obtain different mechanical properties and k values. The extraction of the remaining liquid may be done by the same methods aforementioned in reference to extraction step 405 shown in FIG. 4.

Figure 6:
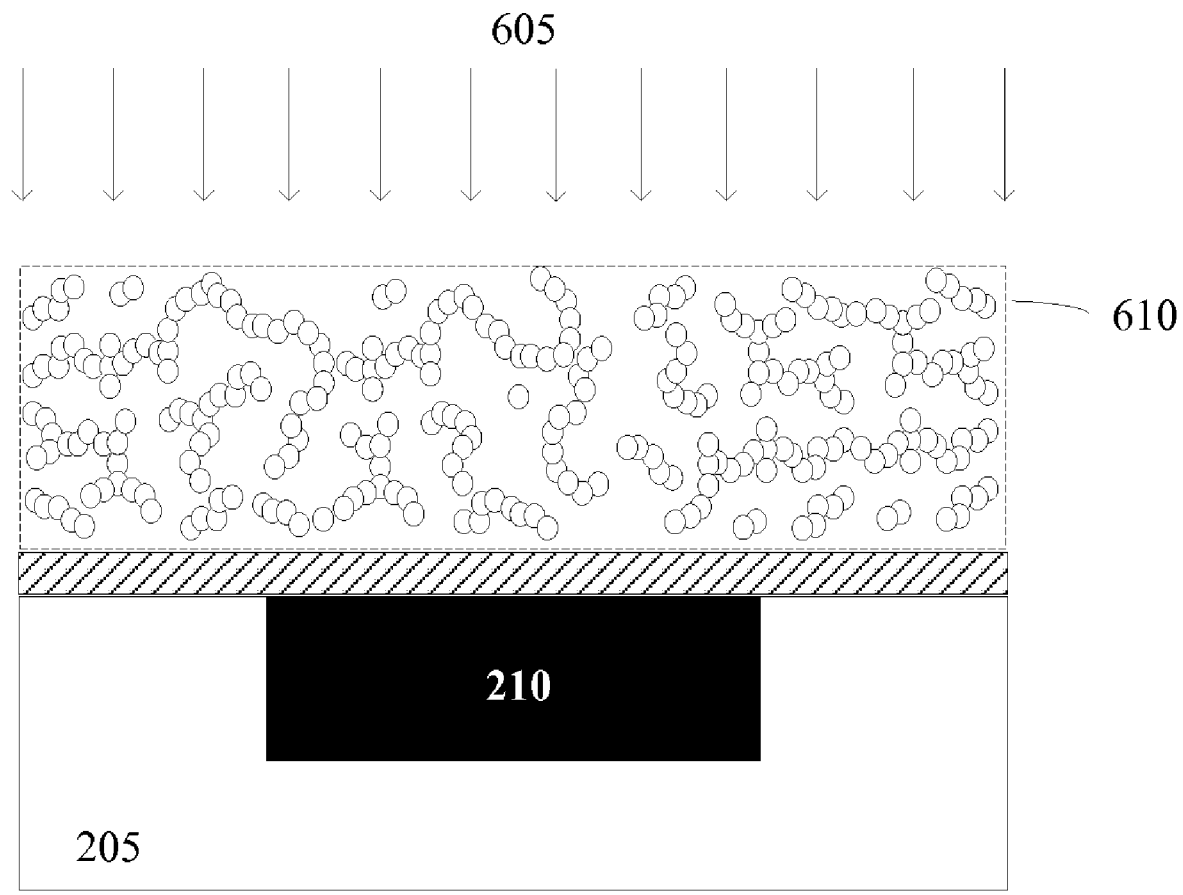
FIG. 6 is a cross-sectional elevation view of FIG. 5 after the structure has been calcinated.

Turning to FIG. 6, wet gel-zeolite composite 410, as shown in FIG. 4, or aerogel-zeolite composite 510, as shown in FIG. 5, may be calcined, as shown by calcination step 605. Calcination step 605 may include heating a wet gel-zeolite composite or an aerogel-zeolite composite. Furthermore, calcinations step 605 may include cooling the wet gel or aerogel zeolite composite to hold/freeze the structure of the composite. As an example, the wet gel or aerogel zeolite composite may be heated in an oven at 400° C. The oven may then be cooled to room temperature freezing the structure of the wet gel or aerogel zeolite composite. Calcination may result in a compression of the wet gel or aerogel zeolite composite, but it is not necessary that the composite reduce in size.

Figure 7:
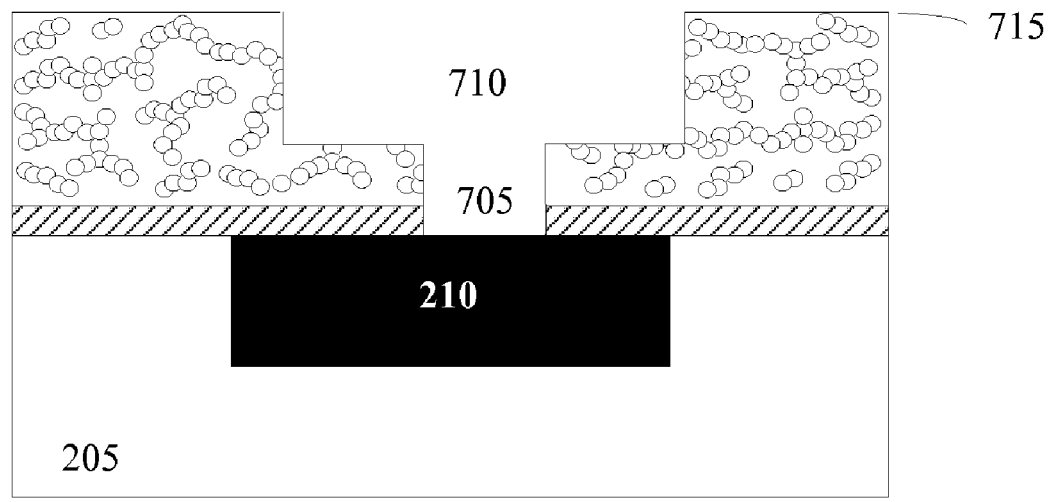
FIG. 7 includes an embodiment of a cross-sectional elevation view of a wet gel zeolite or aerogel zeolite composite film after further Damascene processing, such as forming a via or trench, has been performed.
Figure 8:
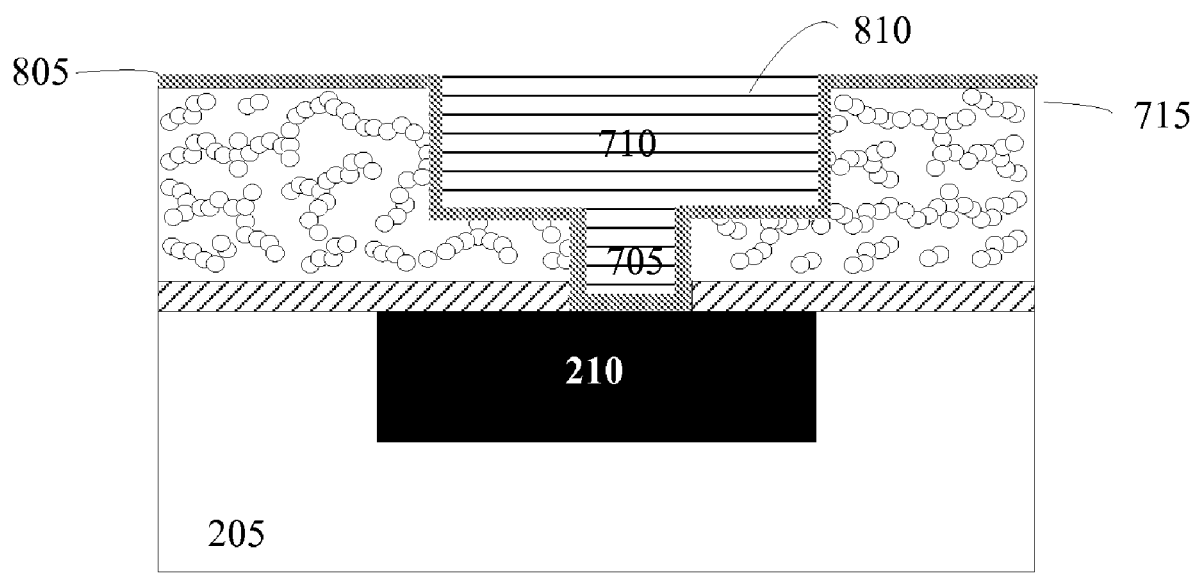
FIG. 8 includes an embodiment of a cross-sectional elevation view of a wet gel zeolite or aerogel zeolite composite film after further Damascene processing, such as depositing a barrier layer, forming conductive material in the via and trench and chemical mechanical polish, has been performed.

Referring to FIG. 7 and FIG. 8 further damascene processing may be done on the wet gel-zeolite or aerogel-zeolite composite film. To simply further damascene processing, FIGS. 7 and 8 depict an aerogel-zeolite composite ILD 715. However, it is readily apparent that any amount of liquid may be removed from a liquid sol-zeolite colloid to form either a wet gel, an aerogel, or anywhere in between a wet gel and aerogel composite with zeolite depending on the properties desired. In FIG. 7, a via opening 705 and a trench 710 is etched in aerogel-zeolite composite ILD 715. In FIG. 8, a barrier layer 805 is deposited on the surfaces of aerogel-zeolite composite ILD 715. Then conductive material 810 is formed in via opening 705 and trench 710. It is apparent that other well-known steps, such as chemical mechanical polish (CMP) and materials, such as copper, tantalum, etc., in the damascene process have been left out so as not to obscure the discussion of the sol gel zeolite composite material.

Therefore, as shown above, a liquid sol-zeolite composite may be deposited on an underlying layer. That liquid sol-zeolite colloid may be formed into wet gel by extracting at least some liquid from the colloid or into an aerogel by extracting approximately all of the liquid from the colloid. Optionally, the wet gel or aerogel zeolite composite may be calcined to freeze the structure. This composite film may obtain the low k values of sol gel dielectric materials without the mechanical weakness, because of the zeolite composite which adds the mechanical strength to the dielectric material. Moreover, the gel-zeolite composite film may form a uniform film unlike the pure zeolite films, which have crystalline structures that make uniform films difficult to form.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
dispersing zeolite particles in a liquid sol to form a zeolite-sol colloid;
depositing the zeolite-sol colloid on an underlying layer; and
extracting a first amount of the liquid from the zeolite-sol colloid to form a wet gel-zeolite composite film, wherein a second amount of the liquid remains in the wet-gel zeolite composite film;
opening a via and a trench in the wet gel-zeolite composite film;
forming a conductive material in the via and the trench of the wet gel-zeolite composite film;
depositing an interlayer dielectric (ILD) on the wet gel-zeolite composite film; and
forming the wet gel-zeolite composite film into an aerogel-zeolite composite film, after forming the conductive material and depositing the ILD.

2. The method of claim 1, wherein extracting a first amount of the liquid comprises: vacuuming the liquid out of the zeolite-sol colloid.

3. The method of claim 1, wherein the sol is a silica sol.

4. The method of claim 1, wherein depositing the zeolite-sol colloid comprises: spin-coating the zeolite-sol colloid on the underlying layer.

5. The method of claim 1, wherein depositing the zeolite-sol colloid comprises: dip-coating the zeolite-sol colloid on the underlying layer.

6. The method of claim 1, wherein extracting a first amount of the liquid comprises: drying the zeolite-sol colloid.

7. The method of claim 6, wherein drying the zeolite-sol colloid comprises: oxidizing the zeolite-sol colloid.

8. The method of claim 1, wherein extracting a first amount of the liquid comprises: heating the zeolite-sol colloid.

9. The method of claim 8, wherein the zeolite-sol colloid is heated under a vacuum.

10. The method of claim 1, wherein forming the wet gel-zeolite composite film into an aerogel-zeolite composite comprises extracting approximately all of the remaining liquid from the wet gel-zeolite composite.

11. The method of claim 10, wherein the ILD comprises a second wet-gel-zeolite composite film, and wherein the second wet-gel zeolite composite film is also formed into an aerogel-zeolite composite film, after forming the conductive material and depositing the ILD.

12. The method of claim 1, wherein dispersing the zeolite particles in the liquid sol comprises:
stirring a first amount of zeolite into the liquid sol.

13. The method of claim 12, wherein the first amount of zeolite is a molar percentage of the zeolite-sol colloid, the molar percentage of zeolite being in the range of one to fifty percent.

14. The method of claim 1, further comprising: calcinating the wet gel-zeolite composite.

15. The method of claim 14, wherein calcinating the wet gel-zeolite composite to form a composite gel-zeolite dielectric layer comprises: oxidizing the wet gel-zeolite composite.

16. The method of claim 14, wherein calcinating the wet gel-zeolite composite comprises: heating the wet gel-zeolite composite; and cooling the wet gel-zeolite composite.

17. The method of claim 16, wherein the wet gel-zeolite composite is heated under a vacuum.

18. The method of claim 1, wherein the sol comprises an alcohol.

19. The method of claim 18, wherein the alcohol is selected from the group consisting of ethanol, methanol, 1- or 2-propanol, or 1-butanol.

20. The method of claim 18, wherein the sol further comprises an acid.

21. The method of claim 20, wherein the acid is selected from a group consisting of hydrochloric (HCl), nitric, sulfuric, phosphoric, hydrofluoric (HF), acetic, or citric acid.

22. The method of claim 20, wherein the sol further comprises a silicon precursor.

23. The method of claim 22, wherein the silicon precursor is selected from a group consisting of tetraethoxysilane (TEOS), tetramethoxysilane-(TMOS), tetrapropozysilane (TPOS), and tetrabutoxysilane (TBOS).

24. The method of claim 23, wherein the acid is selected from a group consisting of hydrochloric (HCl), nitric, sulfuric, phosphoric, hydrofluoric (HF), acetic, or citric acid.

* * * * *